(12) United States Patent
Glebov et al.

(10) Patent No.: US 6,885,781 B2
(45) Date of Patent: Apr. 26, 2005

(54) THIN FILM ELECTRO-OPTICAL DEFLECTOR DEVICE AND A METHOD OF FABRICATION OF SUCH A DEVICE

(75) Inventors: Alexei Glebov, San Mateo, CA (US); Michael G. Lee, San Jose, CA (US)

(73) Assignee: Fujitsu Limited, Kawasaki (JP)

(*) Notice: Subject to any disclaimer, the term of this patent is extended or adjusted under 35 U.S.C. 154(b) by 161 days.

(21) Appl. No.: 10/137,854

(22) Filed: May 3, 2002

(65) Prior Publication Data
US 2003/0206675 A1 Nov. 6, 2003

(51) Int. Cl.[7] .............................. G02F 1/295; G02B 6/10
(52) U.S. Cl. .................. 385/8; 385/2; 385/4; 385/129; 385/131; 438/27; 438/29; 438/31; 438/65; 438/69; 216/24
(58) Field of Search ............................... 385/2, 4, 8, 14, 385/40, 129–132; 438/27, 29, 31, 65, 69; 216/24

(56) References Cited

U.S. PATENT DOCUMENTS

| | | | |
|---|---|---|---|
| 3,801,185 A | 4/1974 | Ramaswamy et al. ....... 385/130 |
| 4,372,642 A | 2/1983 | Singer et al. ................ 385/130 |
| 4,418,980 A | 12/1983 | Keil et al. ....................... 385/1 |
| 4,445,759 A | 5/1984 | Valette ......................... 385/130 |
| 4,547,262 A | 10/1985 | Spillman, Jr. et al. ......... 216/24 |
| 4,778,236 A | 10/1988 | Miyawaki ....................... 385/8 |
| 4,883,561 A | 11/1989 | Gmitter et al. ................ 438/27 |
| 5,122,852 A | 6/1992 | Chang et al. .................. 357/30 |
| 5,209,917 A | 5/1993 | Ohno et al. ................... 423/592 |
| 5,235,663 A | 8/1993 | Thomas ......................... 385/130 |
| 5,315,432 A | 5/1994 | Ohno ............................ 359/326 |
| 5,344,517 A | 9/1994 | Houlding ...................... 156/236 |
| 5,376,580 A | 12/1994 | Kish et al. .................... 437/127 |
| 5,390,210 A | 2/1995 | Fouquet et al. ................ 372/92 |
| 5,401,665 A | 3/1995 | Chan ............................. 437/40 |
| 5,453,325 A * | 9/1995 | Hung et al. .................. 428/469 |
| 5,479,552 A | 12/1995 | Kitamura et al. ............. 385/132 |
| 5,569,565 A * | 10/1996 | Kawakami et al. ............ 430/1 |
| 5,764,820 A | 6/1998 | De Dobbelaere et al. ..... 385/14 |
| 5,785,874 A | 7/1998 | Eda .............................. 216/24 |
| 5,802,223 A * | 9/1998 | Nashimoto ..................... 385/8 |
| 5,909,529 A | 6/1999 | Bhagavatula ............... 385/147 |
| 5,920,662 A | 7/1999 | Hinkov ......................... 385/14 |
| 5,985,022 A | 11/1999 | Fukuda et al. ................ 117/11 |
| 6,010,579 A | 1/2000 | Henley et al. ............. 148/33.2 |
| 6,144,795 A | 11/2000 | Dawes et al. ............... 385/141 |
| 6,146,979 A | 11/2000 | Henley et al. ............. 438/458 |
| 6,151,153 A | 11/2000 | Bryan ........................ 359/245 |
| 6,185,355 B1 | 2/2001 | Hung ........................... 385/132 |
| 6,198,855 B1 | 3/2001 | Hallemeier et al. ............ 385/2 |
| 6,211,991 B1 | 4/2001 | Bryan ........................ 359/254 |
| 6,226,423 B1 | 5/2001 | Minakata et al. ............... 385/2 |
| 6,245,161 B1 | 6/2001 | Henley et al. ............. 148/33.4 |
| 6,335,994 B1 * | 1/2002 | Kato ............................ 385/50 |
| 6,470,125 B1 * | 10/2002 | Nashimoto et al. ......... 385/122 |

FOREIGN PATENT DOCUMENTS

JP 02310540 A * 12/1990 .......... G02F/1/295

OTHER PUBLICATIONS

Osgood et al., "Fabrication of single–crystal lithium niobate films by crystal ion slicing", Applied Physics Letters, vol. 73, No. 16, Oct. 19, 1998.

* cited by examiner

*Primary Examiner*—Akm Enayet Ullah
*Assistant Examiner*—Daniel Petkovsek
(74) *Attorney, Agent, or Firm*—Sheppard Mullin, et al.

(57) ABSTRACT

An electro-optical deflector device, having a thin ferroelectric oxide film and a method of fabricating the deflector device is described. On embodiment of a thin film electro-optic deflector device includes: a planar optical waveguide, having a thin ferroelectric oxide layer; a first electrode, having a conductive substrate and a conductive epoxy; a second electrode coupled to the planar optical waveguide; a supporting substrate; a cladding layer attached to the second electrode deposited on the supporting substrate; and a hole through the supporting substrate and the cladding layer for connecting the second electrode to an external voltage source.

34 Claims, 6 Drawing Sheets

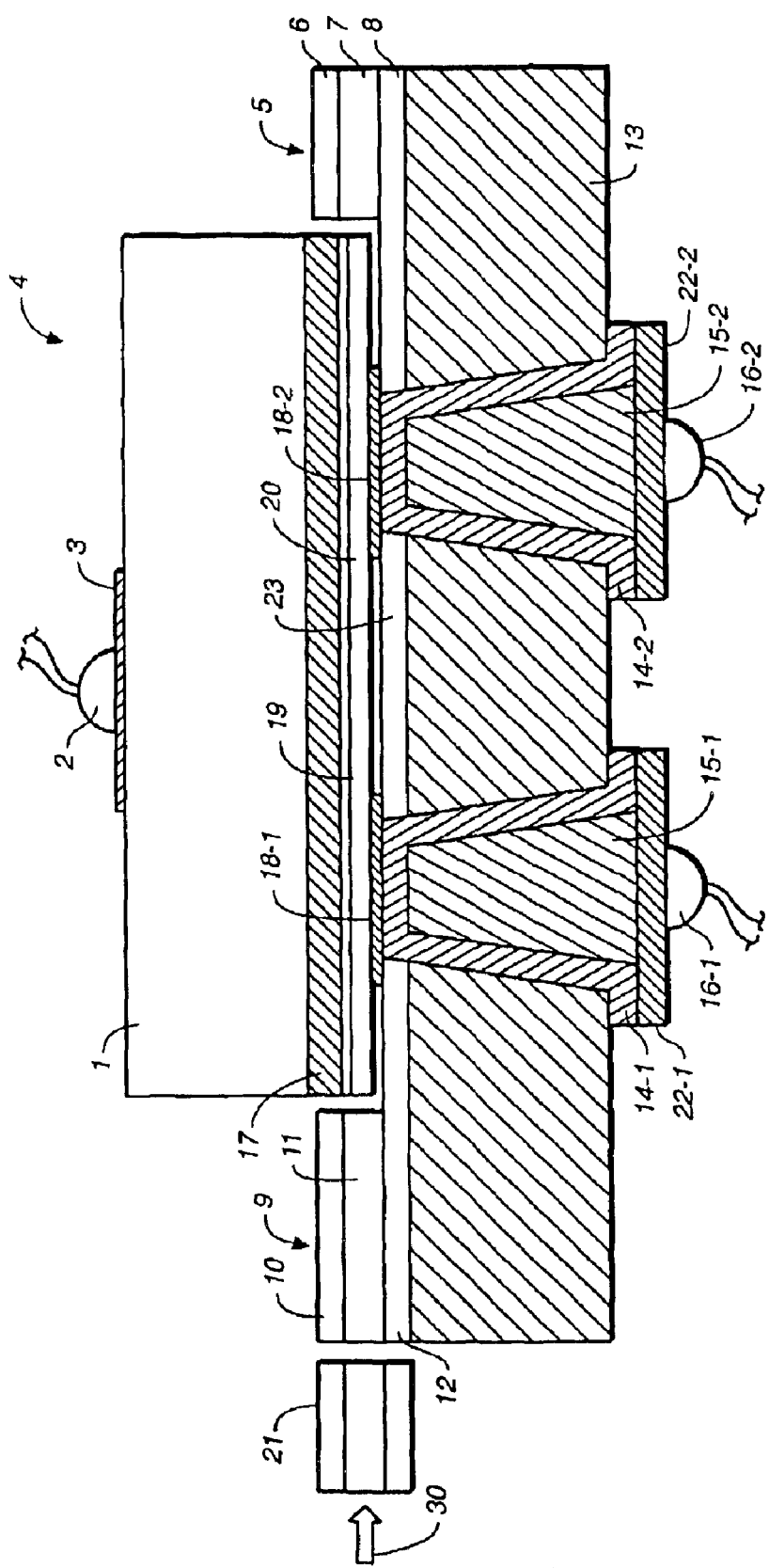
FIG._1

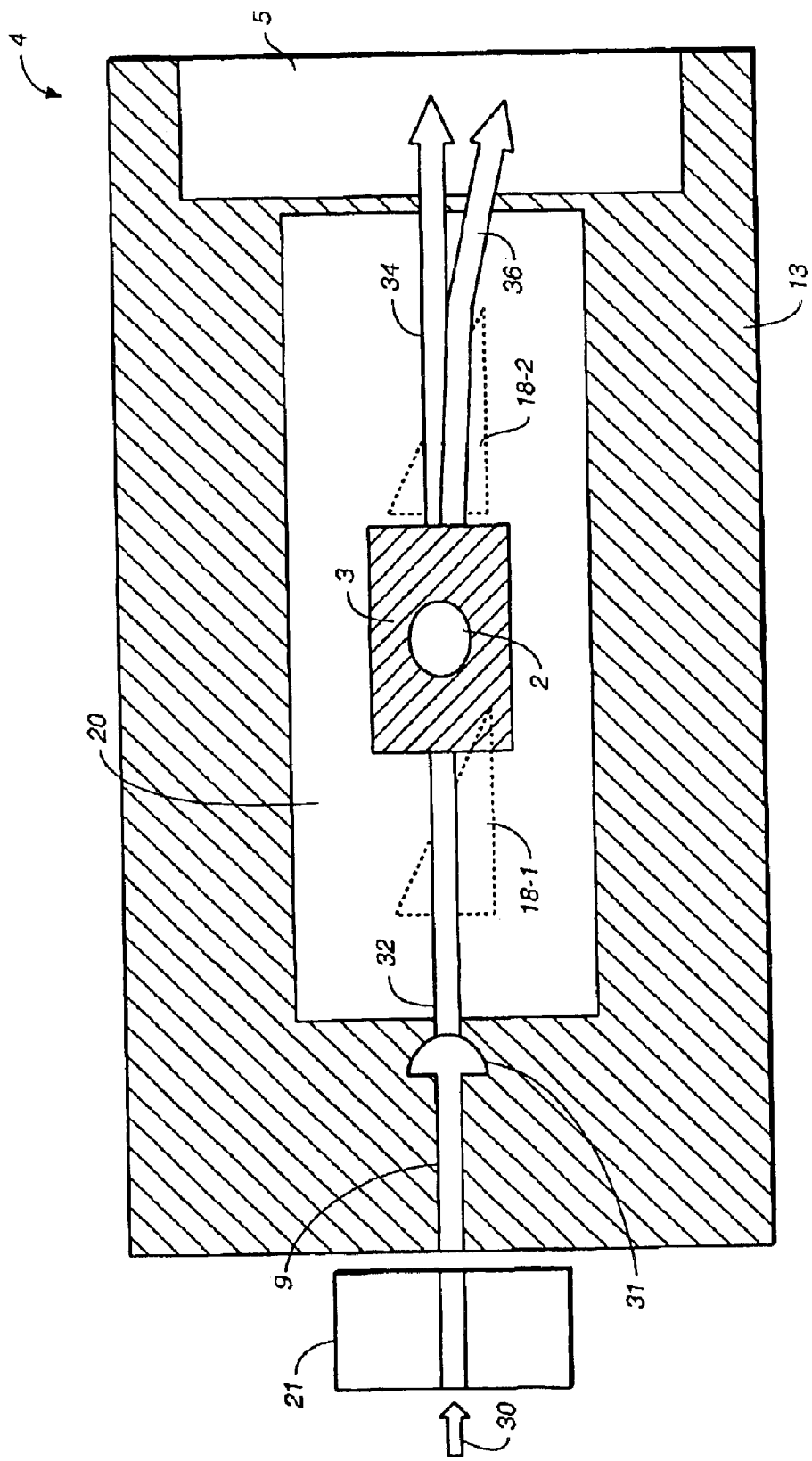
FIG._2

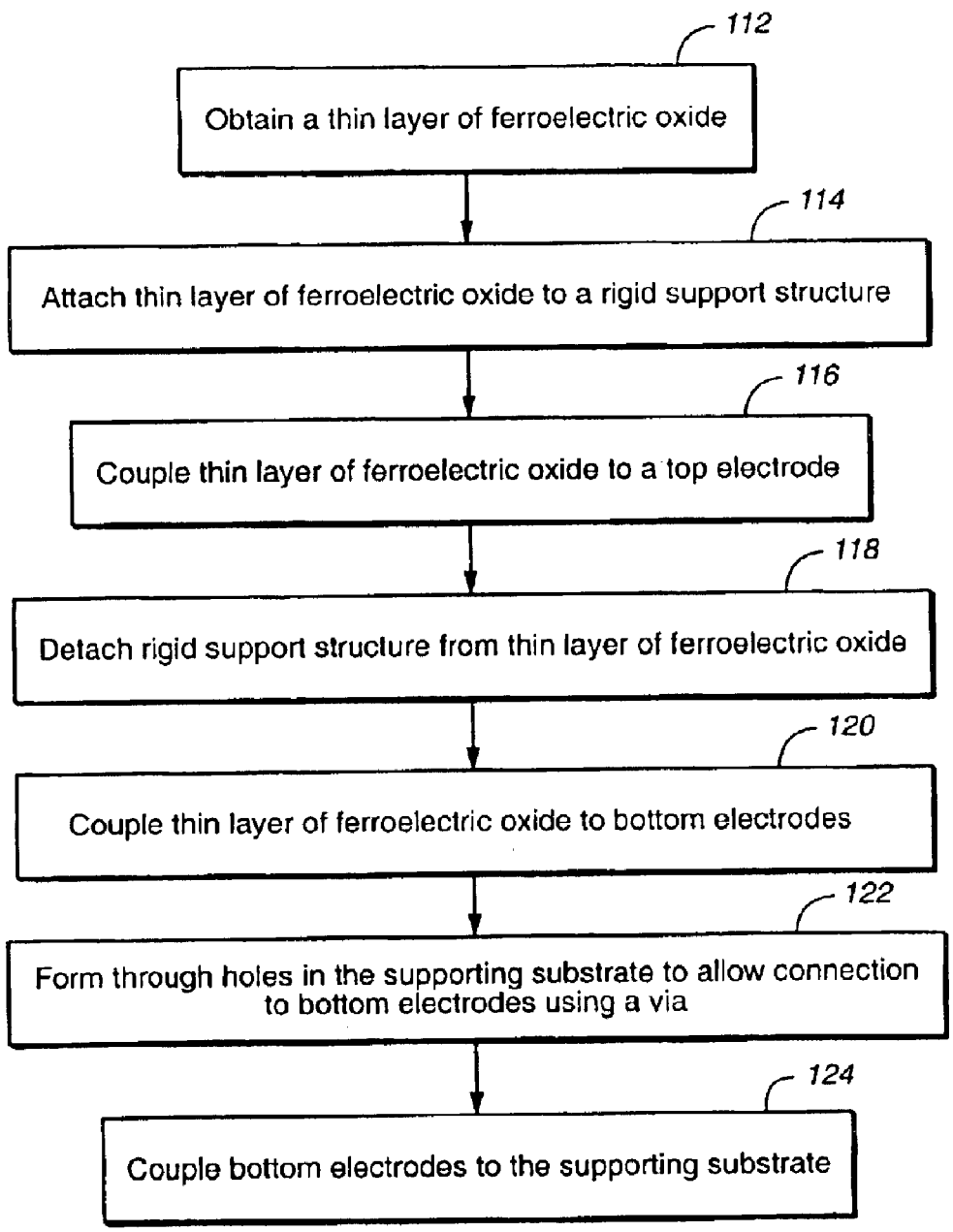
FIG._3

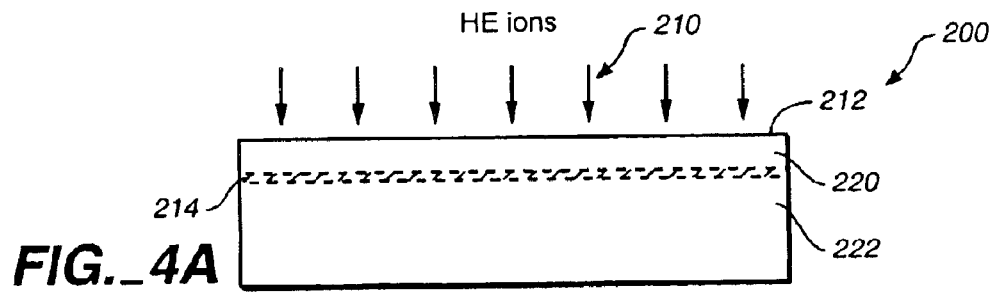
FIG._4A
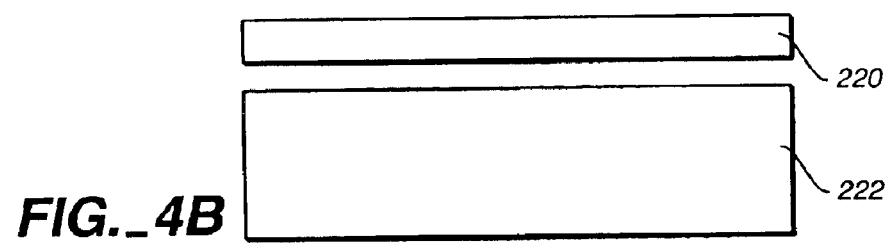
FIG._4B
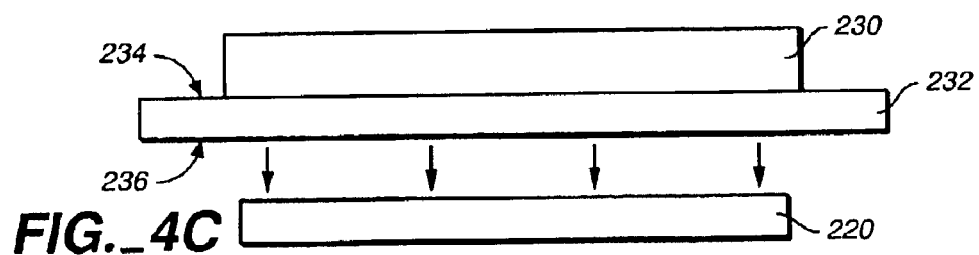
FIG._4C
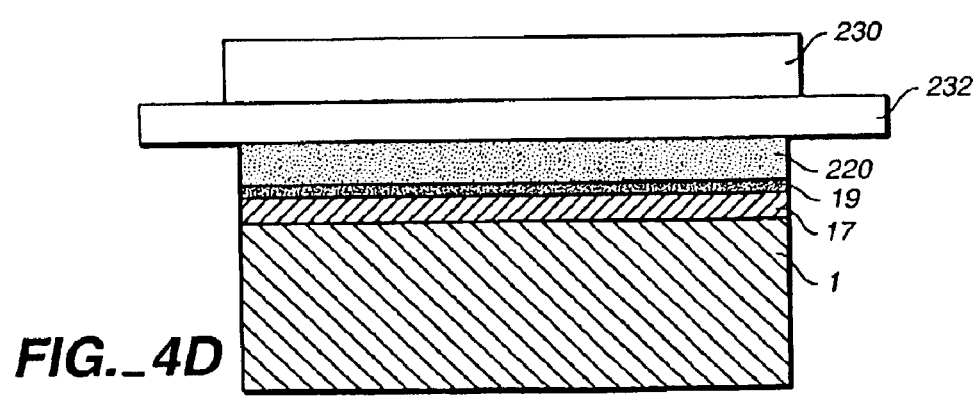
FIG._4D

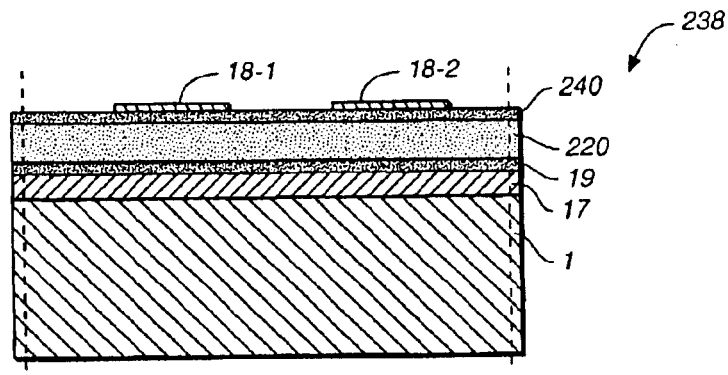
FIG._4E
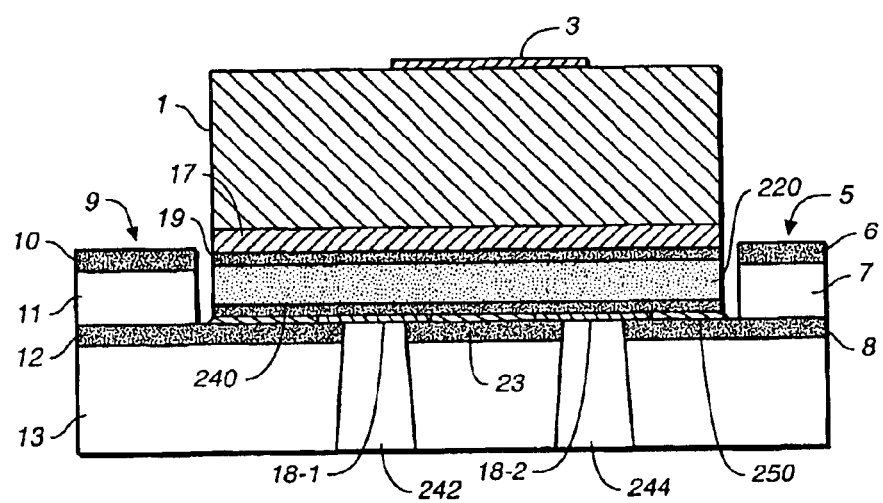
FIG._4F
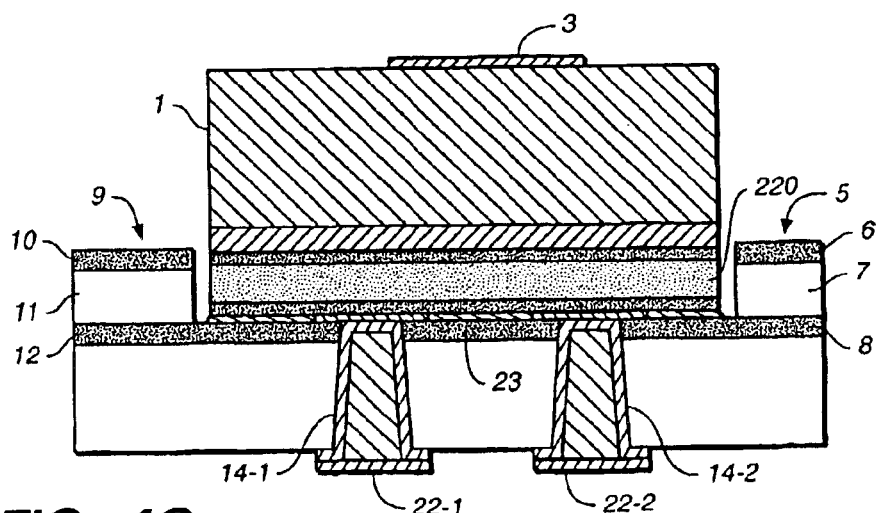
FIG._4G

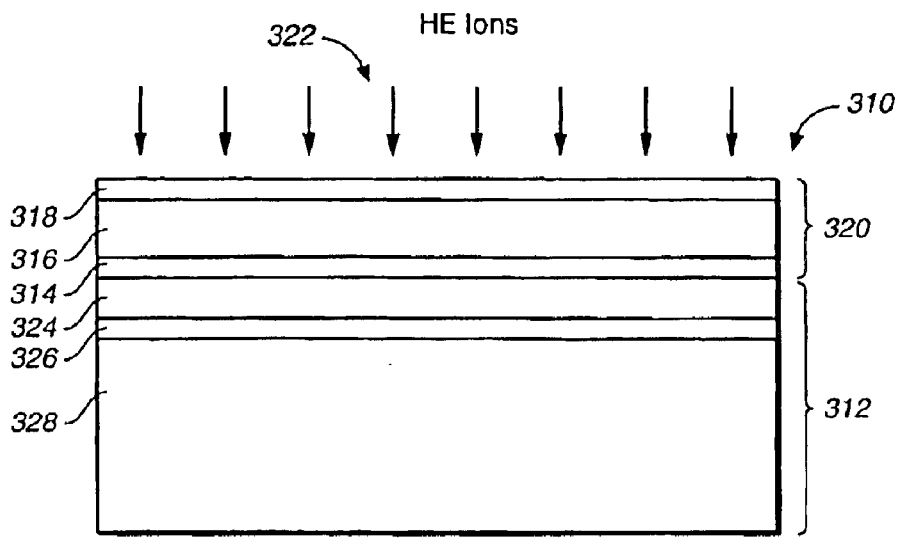
FIG._5A
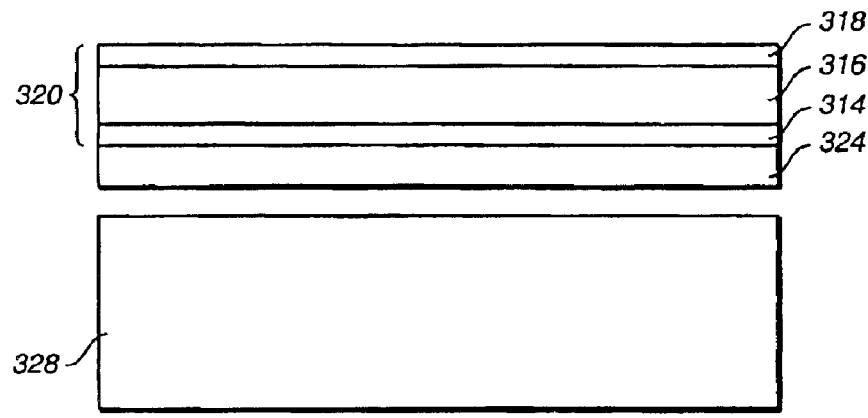
FIG._5B
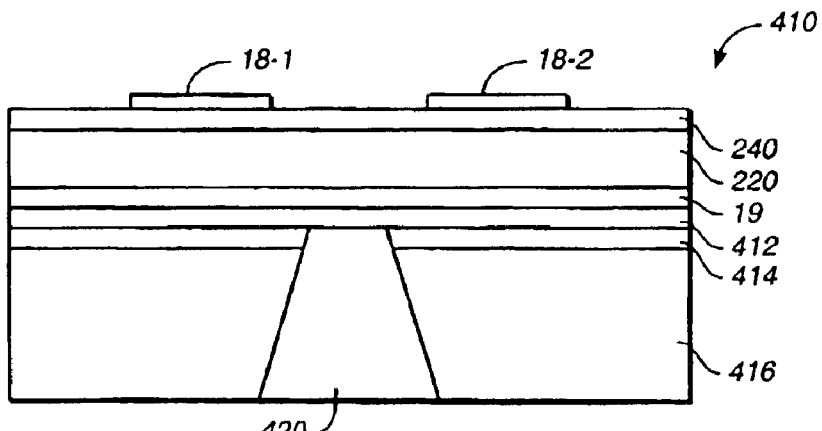
FIG._6

THIN FILM ELECTRO-OPTICAL DEFLECTOR DEVICE AND A METHOD OF FABRICATION OF SUCH A DEVICE

FIELD OF THE INVENTION

The invention relates generally to the field of optical devices, and in particular to thin film electro-optical devices and methods of fabrication of such thin film electro-optical devices.

BACKGROUND OF THE INVENTION

Planar Light-guiding Circuits (PLCs) are optical circuits having planar optical waveguides. These PLCs play an important role in the optical industry in that many optical and electro-optical structures may be put on a single substrate, thus improving the functionality and lowering the costs of optical systems.

Some PLCs, such as optical switches, have electro-optical deflectors, which change the direction of the light propagation through the waveguide. The light is bent by using an externally applied voltage to change the refractive index of the waveguide material. The thinner the waveguide material is, the lower the voltage necessary to provide a given deflection angle. Thus to reduce power consumption and device size, the waveguide material should be made as thin as practical.

Lithium niobate (LN), i.e., LiNbO3, is typically used as the waveguide material for fabrication of PLC electro-optic deflectors. The major problem with using lithium niobate is that the LN crystals are brittle and thus traditionally could not be made thinner than 100–150 $\mu$m. Recently, the research group at Columbia University has developed a technique of Crystal Ion Slicing (CIS), which allows detachment of a LN layer as thin as 5–10 $\mu$m. However, due to the film's brittleness, there is still the problem of taking the thin detached LN film and using it in fabricating the defector. The result is that the size and power consumption of electro-optical deflectors cannot be significantly reduced.

Lithium niobate is just one of a number of ferroelectric oxide materials that can be used in making an electro-optical device. Thus the problem of using a thin brittle material as part of a device fabrication, extends to a layer of any thin ferroelectric oxide material.

Thus there is a need for a process to integrate a thin brittle ferroelectric oxide layer into the fabrication of an electro-optical device and in particular to the integration of a thin lithium niobate layer into the fabrication of an electro-optical deflector device. In addition, a thin film lithium niobate deflector device is needed.

SUMMARY OF THE INVENTION

The present invention includes an electro-optical deflector device, comprising a thin ferroelectric oxide film, which can change the direction of an optical beam propagating in the thin ferroelectric oxide film. The present invention further includes a method of making an electro-optical device, including, but not limited to, the electro-optical deflector device, by detaching a thin ferroelectric oxide layer from a ferroelectric oxide material and, using a first or rigid support substrate, transferring the thin ferroelectric oxide layer to a second substrate for attachment onto the second substrate, where the second substrate is part of the electro-optical device. Examples of ferroelectric oxide include, lithium niobate (LiNbO$_3$), lithium tantalate (LiTaO$_3$), barium titanate, lead zircornium titanate (PZT), and lead lanthanum zirconium titanate (PLZT).

One embodiment of the present invention comprises a method for making a thin film electro-optical device having a substrate. First, a thin and brittle ferroelectric oxide layer is separated from a block of ferroelectric oxide material. Second, the ferroelectric oxide layer is attached to a rigid support structure. The ferroelectric oxide layer is coupled to the substrate and the rigid support structure is detached from the ferroelectric oxide layer.

Another embodiment of the present invention comprises a rigid support structure for transferring a thin and brittle slice of ferroelectric oxide material to a substrate. The rigid support structure includes: a rigid block of solid material having a flat surface; and an adhesive film, where the top surface has a strong adhesive, and the bottom surface has a weak adhesive. The top surface is affixed to the flat surface of the rigid block of solid material, and the bottom surface is affixed to the slice of ferroelectric oxide material.

Yet another embodiment of the present invention comprises a method for making a thin film electro-optical device having a first electrode, where the first electrode includes a conductive substrate and a conductive epoxy. A planar optical waveguide, having a thin ferroelectric oxide film, is affixed to the conductive substrate using the conductive epoxy. Next, a second electrode is deposited on the planar optical waveguide and coupled to a supporting substrate. The first and second electrodes have an electric field which causes the bending of a light signal in the planar optical waveguide.

Another embodiment of the present invention comprises a thin film ferroelectric oxide device including: a planar optical waveguide, having a thin ferroelectric oxide film; a first electrode, having a conductive substrate, where the first electrode is coupled to the planar optical waveguide; and a second electrode coupled to the planar optical waveguide, where an electric field between the first and second electrodes causes the bending of a light signal in the planar optical waveguide.

An embodiment of the present invention comprises a thin film electro-optic device including: a planar optical waveguide, having an electro-optic film less than about 15 microns in thickness; a first electrode, coupled to the planar optical waveguide; and a second electrode coupled to the planar optical waveguide, where a voltage difference between the first and second electrodes causes the bending of a light signal in the planar optical waveguide.

An aspect of the present invention comprises a thin film electro-optic deflector device including: a planar optical waveguide, having a ferroelectric oxide layer less than about 15 microns in thickness; a first electrode, having a conductive substrate and a conductive epoxy, where the first electrode is attached to the planar optical waveguide using the conductive epoxy; a second electrode coupled to the planar optical waveguide, where a voltage difference between the first and second electrodes causes the bending of a light signal in the planar optical waveguide; a supporting substrate; a cladding layer attached to the second electrode and deposited on the supporting substrate; and a hole through the supporting substrate and the cladding layer for connecting the second electrode to an external voltage source. A further aspect includes: an initial optical waveguide having part of the cladding layer and a lens, where the initial optical waveguide is optically aligned with a first end of the planar optical waveguide; and an expander waveguide having another part of the cladding layer, where the expander waveguide is optically aligned with a second end of the planar optical waveguide.

Another aspect of the present invention comprises an electro-optical deflector device, including: means for receiving a single mode light signal from a fiber optic cable; means for propagating the single mode light signal in a ferroelectric oxide film; means for generating an electric field in the ferroelectric oxide film so that the single mode light signal changes a direction of propagation; and after the change in direction, means for transferring the single mode light signal to another optical module.

These and other embodiments, features, aspects and advantages of the invention will become better understood with regard to the following description, appended claims and accompanying drawings.

BRIEF DESCRIPTION OF THE DRAWINGS

FIG. 1 is a side view of the structure of the thin film Lithium Niobate (LN) deflector device of an embodiment of the present invention;

FIG. 2 is a top view of the structure of the thin LN film deflector device of an embodiment of the present invention;

FIG. 3 is a flowchart of the thin film electro-optical device fabrication process of one embodiment of the present invention;

FIG. 4-A shows ions being implanted in a LN block;

FIG. 4-B shows a thin film LN film or layer detached from the LN block;

FIG. 4-C shows a support structure being attached to the thin LN film of an aspect of the present invention;

FIG. 4-D shows the support structure with the thin LN film attached to the conductive substrate of another aspect of the present invention;

FIG. 4-E shows the thin LN film attached to the conductive substrate after the support structure has been removed of a further aspect of the present invention;

FIG. 4-F shows the structure in FIG. 4-E being attached to supporting substrate having first waveguide and expander waveguide;

FIG. 4-G shows the completed deflector unit of an embodiment of the present invention;

FIGS. 5-A and 5-B show the separation of an optical waveguide from a crystal substrate using ion implantation of an alternative embodiment of the present invention;

FIG. 6 is a part of an optical deflector of another embodiment of the present invention.

DETAILED DESCRIPTION OF THE INVENTION

In the following description, numerous specific details are set forth to provide a more thorough description of the specific embodiments of the invention. It is apparent, however, to one skilled in the art, that the invention may be practiced without all the specific details given below. In other instances, well known features have not been described in detail so as not to obscure the invention.

FIG. 1 is a side view of the structure of the thin film LN deflector device 4 of an embodiment of the present invention. A light signal 30 is transmitted through optical fiber 21, which is coupled into a first waveguide 9 which includes a two-dimensional lens 31. The light signal leaves lens 31 of first waveguide 9 and enters a thin LN film (or layer) 20 which is the core of a second waveguide. Without the electro-optic effect, the light beam propagates through the thin LN film 20 without changing the direction of propagation and is transmitted into a slab waveguide expander 5. The light leaving waveguide expander 5 goes to another optical module, for example, another PLC (not shown) or to another optical fiber (not shown). The first waveguide 9 including the lens 31, and the slab waveguide expander 5, both have a light confining structure which is formed by a three layer stack of material having different refractive indexes. The lower (12, 8) and upper (10, 6) clads are formed from a lower refractive index material, whereas the cores (11, 7) of the waveguides (9, 5) are formed from a material with a slightly higher refractive index. The refractive indexes of the clads and cores are chosen, so that the light is confined within the cores (11, 7). The first waveguide 9 and the slab waveguide 5 are formed on a supporting substrate 13, which can be made of any appropriate material such as silicon, glass, laminated board, etc. On top of the thin LN film 20 is an optional top cladding layer 19 which is attached to a conductive substrate 1, e.g., a conductive silicon substrate, by a conductive epoxy layer 17. The top electrode of the deflector includes the conductive epoxy layer 17 and the conductive silicon substrate 1. In addition, a metal film may be optionally deposited on the optional top cladding layer 19 to provide better electrical contact to the conductive epoxy layer 17. Electrical contact pad 3 is formed on the top surface of the conductive substrate 1. Wiring 2 connects the contact pad 3 to an external voltage supply (not shown).

The bottom conductors 18-1 and 18-2 are connected to the thin LN film 20. There may be an optional lower cladding layer (not shown) for thin LN film 20 which would be between thin LN film 20 and bottom electrodes 18-1 and 18-2. Electrical contact of the bottom electrodes 18-1 and 18-2 is made using through holes formed in the support substrate 13, that are plated with metal (14-1 and 14-2) and filled with epoxy or a similar substance (15-1 and 15-2). Bottom electrode wirings 16-1 and 16-2 are attached to the electrical pads 22-1 and 22-2, respectively, on the back side of the supporting substrate 13. The bottom electrodes can be shaped as prisms or gratings by means of a conventional photolythographic technique.

FIG. 2 is a top view of the structure of the thin LN film deflector device 4 of an embodiment of the present invention. A light signal 30 enters the deflector device 4 from optical fiber 21. The light signal propagates through the first waveguide 9 including lens 31, and enters thin LN film 20. The light signal 32 passes over bottom electrode 18-1, represented by a dashed triangle, since the electrode 18-1 is located not at the top of silicon substrate 1, but at the interface between the thin LN film 20 and the lower cladding (12, 8) of the waveguides (9, 5). The light signal 32 propagates under contact pad 3, and over the second electrode 18-2 to slab waveguide 5.

When the thin LN film 20 is connected directly to the bottom electrodes 18-1 and 18-2, and when metal is used for electrodes 18-1 and 18-2, there are light propagation losses from the thin LN film 20, due to light absorption by the bottom metal electrodes 18-1 and 18-2. In order to reduce these light propagation losses, a bottom cladding layer (not shown) can be deposited directly on the thin LN film 20, where the bottom cladding layer (not shown) is opposite the top cladding layer 19. The bottom cladding layer can be a spin coated polymer layer, such as polyimide or epoxy resin, or a sputtered layer of inorganic material such as $SiO_2$ or LN. The thickness of the bottom cladding layer can vary from less than 1 μm to 10 μm depending on the deflector design and, in one embodiment, is from 1 to 5 μm. The metal bottom electrodes 18-1 and 18-2 are then deposited on the bottom cladding layer. When a conductive oxide in used for bottom electrodes 18-1 and 18-2, light absorption is not a significant problem, and the conductive oxide is deposited directly on the thin LN film 20. The cladding on the substrate 13, i.e., 8, 23, and 12, acts as a bottom cladding, and is sufficient to prevent significant light loss from the thin LN film 20.

To induce electro-optic changes of the refractive index in the thin LN film 20, a voltage is applied between the top electrode (1 and 17) and one or both of the bottom electrodes 18-1 and 18-2. Refractive index changes are induced in the LN area of a triangular shape (dotted triangles representing electrodes 18-1 and 18-2 in FIG. 2), that leads to the deflection of the light beam propagating through the thin LN film 20. For example, if there is no electro-optic effect, e.g., no voltage applied between the electrodes 18-1, 18-2, and (1, 17), then the light signal 34 proceeds straight on to slab waveguide 5. If a voltage is applied between the top electrode (1, 17) and bottom electrode 18-2, then an electro-optic effect occurs and the light signal 32, may be bent to give, for example, light signal 36. While FIGS. 1 and 2 depict two triangular shaped bottom electrodes (18-1 and 18-2), other embodiments have one, two, or more bottom electrodes with bottom triangular or other geometric shapes.

FIG. 3 is a flowchart of the thin film electro-optical device fabrication process of one embodiment of the present invention. In step 112 a thin layer of ferroelectric oxide is obtained from a bulk ferroelectric oxide material. The thin layer of ferroelectric oxide may be created by, for example, obtaining a bulk piece of ferroelectric oxide by conventional means and slicing a 5 to 10 $\mu$m layer from the bulk piece using crystal ion slicing. Because the layer of ferroelectric oxide is thin, the layer is brittle. Thus the thin layer of ferroelectric oxide is affixed or attached to a hard, rigid support structure (step 114), in order to use the thin layer in making the electro-optical device without the thin layer cracking or breaking. The support structure cannot be flexible. The thin layer of ferroelectric oxide is then directly or indirectly coupled to a top electrode, e.g., conductive epoxy 17 and substrate 1 (step 116), where there may be an optional cladding between the thin layer of ferroelectric oxide and the top electrode. At step 118, the hard, rigid support structure is detached from the thin layer of ferroelectric oxide, because the top electrode now provides the support for the thin layer. The thin layer is directly or indirectly coupled to a one or more bottom electrodes (step 120), where there may be an optional cladding between the thin layer of ferroelectric oxide and the bottom electrodes. In one embodiment, the bottom electrodes are created, by first, depositing a metal film on top of the thin layer of ferroelectric oxide. Then the metal film is coated with a photoresist layer, and the shape of the bottom electrodes is formed in the photoresist layer by means of photolithography. The metal layer is etched to the shape of the bottom electrodes through the photoresist layer. Lastly, the photoresist is stripped. In other embodiments, other conventional techniques for patterning metal layers may be used to create the bottom electrodes. At step 122, through holes in a supporting substrate are created in order to connect the bottom electrodes using vias to one or more voltage sources. The bottom electrodes on the thin layer of ferroelectric oxide are then connected to the supporting substrate in the areas above the vias (step 124). In an alternative embodiment, step 124 is performed before step 122. That is the bottom electrodes are first coupled to the supporting substrate (step 124). Next, near through holes are formed in the supporting substrate to allow blind vias to connect the bottom electrodes to one or more voltage sources (step 122). The result of the above process is a planar electro-optical device with a thin layer of ferroelectric oxide with the properties of the bulk ferroelectric oxide material. The light signal in the thin layer of ferroelectric oxide can be bent by applying a voltage to the top and bottom electrodes. Because the thin layer of ferroelectric oxide of the present invention is substantially thinner than the ferroelectric oxide layer in a conventional electro-optical device, there is a substantial reduction in the operating voltage, and hence the power consumption.

A "thin" ferroelectric oxide film or layer, as used herein, is a ferroelectric oxide film or layer of thickness generally below 100 $\mu$m, and in particular a thickness below 50 $\mu$m. In the preferred embodiment a thin electro-optic film or layer has a maximum thickness of about 10 to 15 $\mu$m and is sliced, after He+ implantation, from a larger block of electro-optic material. In an alternative embodiment a thin electro-optic film or layer is polished down to about 25–50 $\mu$m in thickness from a larger block of electro-optic material. One use for a ferroelectric oxide film or layer with a thickness less than 15 $\mu$m is for the propagation of a single mode light signal.

FIGS. 4-A through 4-G illustrate the steps in the process of fabricating a thin film electro-optical deflector device of another embodiment of the present invention. FIG. 4-A corresponds to step one, FIG. 4-B to step two, and so on, until FIG. 4-G which corresponds to step seven. The labels in FIGS. 1 and 2 are repeated in FIGS. 4-A through 4-G in order to clarify which part of thin film electro-optical deflector 4 is being fabricated in which step.

FIG. 4-A shows ions being implanted in a LN block. First, LN blocks, e.g., LN block 200 (FIG. 4-A), of about 0.5–1.0 mm thick are diced from a piece of LN material, which may be as large as 10×10 mm$^2$. The top surface of the LN block 200 (FIG. 4-A) is optically polished. In addition the sides of, the LN block 200 may be polished to minimize chips induced by dicing. High energy He+ ions 210 are radiated onto the surface 212 of LN block 200. The high energy He+ ion implantation results in the damage of a sub-surface layer of the LN block 200. This damage is concentrated in a very narrow zone of about 1 $\mu$m which is located about 5–10 $\mu$m below the surface 212. The narrow zone is shown in the FIG. 4-A by the area 214. For example, when the ion radiation energy is about of 3.8 MeV, the damage area 214 is concentrated about 10 $\mu$m below the surface 212. The area above the damaged area 214, i.e., LN film or layer 220, and the layer 222 below the damaged area is not significantly affected. The damaged area 214 has a much higher etch rate in hydrofluoric acid solutions compared to the undamaged crystal. The LN block 200 is annealed by a rapid thermal annealing process for about 30–60 seconds at about 300–400° C. to increase the etch rate selectivity.

FIG. 4-B shows a thin film LN film or layer 220 detached from LN block 200. In this second step, the 5–10 $\mu$m LN film or layer 220 is detached from the rest 222 of LN block 200 by wet etching in a 5–25% aqueous solution, because of the large etch selectivity between the damaged and undamaged zones. A buffered oxide etch solution typical for wet etch processing in semiconductor industry can also be used. The etching occurs from the sides inward until the thin film LN film or layer 220 is separated from the rest 222 of LN block 200. Depending on the pre-treatment and etching conditions, the etch rates can be from 10 to 200 $\mu$m per hour.

To restore the crystalline and optical properties of the a detached LN film 220, the LN film should be post annealed for about 1 hour at 700° C. After this annealing, the crystalline properties of the thin LN film 220 are comparable to those of the large LN crystal block 200, before ion implantation. Thus, this process allows the fabrication of a free standing thin LN films with bulk LN properties.

FIG. 4-C shows a support structure 230 being attached to the thin-LN film 220 of an aspect of the present invention. The thin LN film 220 is brittle and is very likely to crack or break, when used in an electro-optical device fabrication process. Hence, to manipulate the thin LN film 220, in step three, the thin LN film 220 is transferred to a rigid support structure, for example, a solid rigid support substrate 230. The rigid support substrate 230 can be from any solid material, preferentially transparent for better sample control. For example, the rigid support substrate 230 may be a small LN block 0.5 mm thick. The rigid support substrate 230 is affixed to a Gel-Pack film 232. Gel-Pack films have two-sides (234 and 236), and each side has its own surface adhesives: a top side 234 has a standard strong adhesive material, while a bottom side 236 has a special gel surface with a very weak adhesive. The rigid support substrate 230 is affixed to the top side 234 with the strong adhesive, whereas the thin LN film 220 is affixed on the bottom side 236 with the weak adhesive.

FIG. 4-D shows the support structure with the thin LN film 220 (i.e., thin LN film 20 of FIG. 1) attached to the conductive substrate 1 of an aspect of the present invention. In this step four, an optional top cladding layer 19 with a lower refractive index than the film may be deposited on the surface of the thin LN film 220. In addition, a thin metal layer (not shown) may optionally be deposited on the top cladding layer 19 in order to improve electrical contact to the conductive epoxy 17. Then, the stack (230-232-220) is attached to the conductive substrate 1 with the conductive epoxy 17, where the conductive substrate 1 and the conductive epoxy 17 form the top electrode.

FIG. 4-E shows the thin LN film 220 attached to the conductive substrate 1 after the support structure has been removed of a further aspect of the present invention. In this step five, the rigid support substrate 230 with the Gel-Pack film 232 is removed from the thin LN film 220 by delaminating of the Gel-Pack's weak adhesive side 236 from the thin LN film 220 in acetone or any other solvent. Optionally, a bottom cladding 240 is deposited on top of the thin LN film 220. Next, the triangular shaped electrodes 18-1 and 18-2 are deposited and patterned on top of the bottom cladding 240 (or thin LN film 220, if there is no bottom cladding 240). The side walls of the thin LN film 220 are optically polished using conventional techniques. The optical polishing is feasible, because the brittle thin LN film 220 is attached to conductive substrate 1, which provides the structural support for the polishing.

FIG. 4-F shows the structure in FIG. 4-E being attached to supporting substrate 13 having first waveguide 9 and expander waveguide 5. In this step six, the supporting substrate 13 is fabricated with first or initial waveguide 9 and expander waveguide 5. Through holes 242 and 244 are formed in the supporting substrate 13, by one of the conventional techniques appropriate for the substrate material. For example, in the case of a silicon supporting substrate 13, the through holes 242 and 244 can be plasma etched or laser drilled or blasted. The three optical layers for the first waveguide 9 and expander waveguide 5, i.e., lower cladding layers (8, 12), core layers (7,11), and upper cladding layers (6,10), are deposited (e.g. silica films deposited by flame-hydrolysis deposition) and patterned to form the first waveguide 9 and expander waveguide 5. A thin layer of adhesive, e.g., adhesive layer 250, is spread on top of the lower cladding layers (8, 12). The thickness of the adhesive may be as low as 0.5–1 μm. Low viscosity waxes or epoxy resins can be used as adhesives for this process. The structure 238 in FIG. 4-E is vertically flipped and attached to the lower cladding layers (8, 23, 12) with the adhesive film (e.g. 250). This step levels the cores of the first waveguide 9 and expander waveguide 5, and the thin LN film 220. Adhesive residues, if present, are cleaned from the bottom electrodes 18-1 and 18-2 with solvent through the holes 242 and 244. An electric pad 3 is deposited on top of the conductive substrate 1. In an alternative embodiment when the bottom clad 240 is made from optical organic materials, the structure 238 (FIG. 4-E) is attached directly to lower cladding layers (12, 23, 8) by a conventional temperature pressure treatment.

FIG. 4-G shows the completed deflector unit of an embodiment of the present invention. And at this last step seven, using the structure 252 of FIG. 4-F, blind electrical vias 14-1 and 14-2 are formed in the through holes 242 and 244, respectively. Conventional via forming techniques known to the skilled in the art can be used to fill the through holes 242 and 244. Conductive pads 22-1 and 22-2 are attached to the vias 14-1 and 14-2, respectively. Wiring is attached to the top 3 and bottom (22-1, 22-2) electrical pads. Some of the conventional techniques used for wiring include, wirebonding, fan out through redistribution layers, flip-chip bonding with a substrate with a fan out structure, and tape automated bonding.

In FIG. 4-G the bottom electrodes 18-1 and 18-2 are contacted through the blind vias 14-1 and 14-2 formed in through holes 242 and 244, after the structure 238 of FIG. 4-E is mounted on the supporting substrate 13 (FIG. 4-F). This is different from the conventional process which is to fan out the signal through redistribution layers built on top of the cladding (8, 23, 12). The conventional process first forms a conductive redistribution structure on cladding (8, 23, 12), before the structure 238 of FIG. 4-E is mounted on the supporting substrate 13. The conventional process has assembly problems, especially with regard to leveling structure 238 with the surrounding waveguides 5 and 9, and having adhesive uniformity (e.g., 250) to maintain uniform electric field across the thin LN film layer 220. Contacting the bottom pads with through-vias after mounting structure 238 of FIG. 4-E avoids these assembly problems. In addition an advantage in using vias or blind vias rather than using metal paths on the surface of cladding (8, 23, 12) is that routing density can be increase significantly. This completes the fabrication process of the electro-optic deflector device.

FIGS. 5-A AND 5-B show the separation of an optical waveguide from a crystal substrate using ion implantation of an alternative embodiment of the present invention. In FIG. 5-A a substrate 312 of a crystal material has an electro-optic waveguide 320 grown on top. In one embodiment the substrate 312 and the electro-optic waveguide 320 are the same or similar materials, e.g., a ferroelectric oxide. In another embodiment the substrate 312 is of a different material than the electro-optic waveguide 320. The electro-optic waveguide 320 comprises a lower clad 314, a core 316, and an upper clad 318. The core 316 comprises a ferroelectric oxide material, e.g., lithium niobate. The lower clad 314 is first deposited on the substrate 312; next, the core 316 is deposited on top of the lower clad 314; and lastly, the upper clad 318 is deposited on top of the core 316. The surface of the electro-optic waveguide 320 is radiated with He+ ions 322. The He+ ions 322 pass through a first layer 324 of substrate 312 and leave the crystals in the first layer 324 mostly undamaged. A second layer 326 is a narrow zone where most of the damage occurs to the crystal material. The third layer 328 is also relatively undamaged. Like in FIG. 4-A, the damaged second layer 326 has a faster etch rate than the relatively undamaged first 324 and third 328 layers. A hydrofluoric acid solution is used to separate out the waveguide 320 and first layer 324 from the third layer 328, as shown in FIG. 5-B. The waveguide 320 and first layer 324 replaces the "thin layer of ferroelectric oxide" in the flowchart of FIG. 3.

FIG. 6 is a part of an optical deflector of another embodiment of the present invention. FIG. 6 is like FIG. 4-E, except the conductive substrate 1 and conductive epoxy layer 17 have been replaced by a metal layer 412 affixed to a non-conductive substrate 416 by a non-conductive adhesive layer 414. A through hole 420 is made in substrate 416 and adhesive layer 414 to allow a blind via (not shown) to connect the metal layer 412 to an electrical pad 3 (not shown). Hence the top electrode is the metal layer 412 (rather than the conductive substrate 1 and conductive epoxy layer 17 of FIG. 4-E), which is connected to an external voltage source using a blind via (not shown) in through hole 420.

In the device structure presented in FIG. 1 the blanket electrode (conductive substrate 1 and conductive epoxy 17) is at the top of the deflector 4, while the patterned electrodes (18-1 and 18-2) are at the bottom facing the supporting substrate 13. In an alternative embodiment, the position of the electrodes may be reversed, i.e., the patterned electrodes can be built on top of the device, while the blanket electrode can be placed at the bottom facing the supporting substrate 13. In this case, the fabrication process flow is modified accordingly.

The specification and drawings are to be regarded in an illustrative rather than a restrictive sense. It will, however, be evident that additions, subtractions, deletions, and other modifications and changes may be made thereunto without departing from the broader spirit and scope of the invention as set forth in the claims.

What is claimed is:

1. A method for making a thin film electro-optical device, comprising a first electrode, said first electrode comprising a conductive substrate and a conductive epoxy, said method comprising:
    affixing a planar optical waveguide, comprising a thin ferroelectric oxide film, to said conductive substrate using said conductive epoxy;
    depositing a second electrode on said planar optical waveguide; and
    coupling said second electrode to a supporting substrate, wherein an electric field between said first and second electrodes causes bending of a light signal in said planar optical waveguide.

2. The method of claim 1 further comprising depositing a cladding layer on said supporting substrate, wherein said coupling said second electrode to a supporting substrate comprises affixing said cladding layer to said second electrode.

3. The method of claim 1 further comprising depositing a cladding layer on said supporting substrate, wherein said coupling said second electrode to a supporting substrate comprises affixing said cladding layer to said planar optical waveguide by temperature pressure treatment.

4. The method of claim 1 further comprising creating said thin ferroelectric oxide film by using crystal ion slicing to remove said thin ferroelectric oxide film from a larger block of ferroelectric oxide material.

5. The method of claim 1 further comprising:
    depositing a first cladding layer on a separate substrate;
    depositing said thin ferroelectric oxide film on said first cladding layer;
    depositing a second cladding layer on said thin ferroelectric oxide film; and
    using helium ion implantation, slicing said separate substrate into a first part and a second part, wherein said planar optical waveguide further comprises said first part, said first cladding layer, and said second cladding layer.

6. The method of claim 1 further comprising:
    creating a near through hole in said supporting substrate; and
    forming a blind via in said near through hole to electrically connect said second electrode to a conductive pad.

7. The method of claim 1 further comprising:
    creating a through hole in said supporting substrate;
    forming in said through hole a via, wherein said via is connected to said second electrode; and
    affixing a conductive pad to said via.

8. A thin film ferroelectric oxide device comprising:
    a planar optical waveguide comprising a thin ferroelectric oxide film;
    a first electrode comprising a conductive substrate, said first electrode coupled to said planar optical waveguide; and
    a second electrode coupled to said planar optical waveguide, wherein an electric field between said first and second electrodes causes bending of a light signal in said planar optical waveguide;
    wherein said planar optical waveguide comprises a core, comprising said thin ferroelectric oxide film, and a top cladding layer and
    wherein said first electrode is coupled to said planar optical waveguide by affixing said top cladding layer to said conductive substrate using a conductive epoxy.

9. A thin film ferroelectric oxide device comprising:
    a planar optical waveguide comprising a thin ferroelectric oxide film;
    a first electrode comprising a conductive substrate, said first electrode coupled to said planar optical waveguide; and
    a second electrode coupled to said planar optical waveguide, wherein an electric field between said first and second electrodes causes bending of a light signal in said planar optical waveguide;
    wherein said first electrode further comprises a conductive epoxy layer.

10. The thin film ferroelectric oxide device of claim 9 further comprising: a supporting substrate coupled to said second electrode.

11. The thin film ferroelectric oxide device of claim 10 further comprising:
    a first cladding layer deposited on said supporting substrate, and wherein said supporting substrate is coupled to said second electrode by affixing said first cladding layer to said second electrode.

12. The thin film ferroelectric oxide device of claim 11 wherein said planar optical waveguide comprises a core and a second cladding layer, said core comprising said thin ferroelectric oxide film.

13. The thin film ferroelectric oxide device of claim 12 wherein said second electrode, comprises a conductive oxide material and wherein said second electrode is affixed to said core.

14. The thin film ferroelectric oxide device of claim 11 wherein said planar optical waveguide comprises a core, a second cladding layer, and a third cladding layer, said core comprising said thin ferroelectric oxide film.

15. The thin film ferroelectric oxide device of claim 14 wherein said second electrode comprises a metal, and wherein said second electrode is affixed to said third cladding layer.

16. The thin film ferroelectric oxide device of claim 10 further comprising:
a first cladding layer deposited on said supporting substrate, and wherein said supporting substrate is coupled to said second electrode by affixing said first cladding layer to said planar optical waveguide.

17. A thin film ferroelectric oxide device comprising:
a planar optical waveguide comprising a thin ferroelectric oxide film;
a first electrode comprising a conductive substrate, said first electrode coupled to said planar optical waveguide;
a second electrode coupled to said planar optical waveguide, wherein an electric field between said first and second electrodes causes bending of a light signal in said planar optical waveguide;
a supporting substrate coupled to said second electrode; and
a first cladding layer deposited on said supporting substrate, wherein said supporting substrate is coupled to said second electrode by affixing said first cladding layer to said second electrode;
wherein said planar optical waveguide comprises a core and a second cladding layer, said core comprising said thin ferroelectric oxide film; and
wherein said first electrode further comprises a conductive epoxy layer, said conductive epoxy layer affixing said second cladding layer to said conductive substrate.

18. A thin film ferroelectric oxide device comprising:
a planar optical waveguide comprising a thin ferroelectric oxide film;
a first electrode comprising a conductive substrate, said first electrode coupled to said planar optical waveguide;
a second electrode coupled to said planar optical waveguide, wherein an electric field between said first and second electrodes causes bending of a light signal in said planar optical waveguide;
a supporting substrate coupled to said second electrode;
a first cladding layer deposited on said supporting substrate, and wherein said supporting substrate is coupled to said second electrode by affixing said first cladding layer to said second electrode;
a second cladding layer, and a third cladding layer, said core comprising said thin ferroelectric oxide film;
wherein said first electrode further comprises a conductive epoxy layer, said conductive epoxy layer affixing said second cladding layer to said conductive substrate.

19. A thin film ferroelectric oxide device comprising:
a planar optical waveguide formed on a first substrate comprising a thin ferroelectric oxide film;
a first electrode coupled to said planar optical waveguide;
a second electrode coupled to said planar optical waveguide, wherein an electric field between said first and second electrodes causes bending of a light signal in said planar optical waveguide; and
a second substrate for supporting said first substrate, said second substrate being coupled to said second electrode;
wherein said second substrate, comprises a via extending through the thickness of said supporting substrate, said via being electrically coupled to said second electrode.

20. The thin film ferroelectric oxide device of claim 19 comprising a plurality of second electrodes and a plurality of vias, and wherein said each of said second electrodes is electrically connected to at least one of said vias.

21. The thin film ferroelectric oxide device of claim 19 further comprising an electric pad electrically connected to said via.

22. The thin film ferroelectric oxide device of claim 19 wherein said thin ferroelectric oxide film is less than 100 microns thick.

23. The thin film ferroelectric oxide device of claim 19 wherein said thin ferroelectric oxide film is less than 50 microns thick.

24. The thin film ferroelectric oxide device of claim 19 wherein said thin ferroelectric oxide film is less than 15 microns thick.

25. The thin film ferroelectric oxide device of claim 19 wherein said thin ferroelectric oxide film is about 5 to 10 microns thick.

26. The thin film ferroelectric oxide device of claim 19 wherein said thin ferroelectric oxide film comprises a material selected from a group consisting of lithium niobate (LiNbO3), lithium tantalate (LiTaO3), barium titanate, lead zircornium titanate (PZT), and lead lanthanum zirconium titanate (PLZT).

27. A thin film electro-optic device comprising:
a planar optical waveguide mounted on a substrate, comprising an electro-optic film less than about 15 microns in thickness;
a first electrode coupled to said planar optical waveguide; and
a second electrode positioned between said planar optical waveguide and said substrate and coupled to said planar optical waveguide, said substrate comprising at least one via extending through the entire thickness of said substrate for coupling an electrical potential from the bottom of said substrate to said second electrode, wherein an voltage difference between said first and second electrodes causes bending of a light signal in said planar optical waveguide.

28. The thin film electro-optic device of claim 27 comprising a plurality of said vias.

29. A thin film electro-optic deflector device comprising:
a planar optical waveguide, comprising a ferroelectric oxide layer less than about 15 microns in thickness;
a first electrode, attached to said planar optical waveguide using conductive epoxy;
a second electrode coupled to said planar optical waveguide, wherein an electric field between said first and second electrodes causes bending of a light signal in said planar optical waveguide;
a supporting substrate;
a cladding layer attached to said second electrode and deposited on said supporting substrate; and
a via extending through said supporting substrate and said cladding layer for connecting said second electrode to an external voltage source.

30. The thin film electro-optic deflector device of claim 29 further comprising:
an initial optical waveguide comprising part of said cladding layer and a lens, said initial optical waveguide optically aligned with a first end of said planar optical waveguide; and
an expander waveguide comprising another part of said cladding layer, said expander waveguide optically aligned with a second end of said planar optical waveguide.

31. The thin film electro-optic deflector device of claim 29 wherein said thin ferroelectric oxide layer comprises a material selected from a group consisting of lithium niobate (LiNbO3), lithium tantalate (LiTaO3), barium titanate, lead zircornium titanate (PZT), and lead lanthanum zirconium titanate (PLZT).

32. The thin film electro-optic deflector device of claim 29 wherein said thin ferroelectric oxide layer is sliced from a block of ferroelectric oxide material using crystal ion slicing.

33. The thin film ferroelectric oxide device of claim 29 wherein said planar optical waveguide comprises a core, comprising said thin ferroelectric oxide film, and a top cladding layer.

34. The thin film ferroelectric oxide device of claim 33 wherein said planar optical waveguide further comprises a bottom cladding layer and wherein said second electrode is deposited on said bottom cladding layer.

* * * * *